United States Patent [19]
Gaudette et al.

[11] Patent Number: 5,253,414
[45] Date of Patent: Oct. 19, 1993

[54] TOOL BANK FOR SURFACE MOUNT MACHINE

[75] Inventors: Arthur L. Gaudette, Ipswich; Mark E. Rossmeisl, Beverly, both of Mass.

[73] Assignee: Emhart Inc., Newark, Del.

[21] Appl. No.: 823,668

[22] Filed: Jan. 21, 1992

[51] Int. Cl.⁵ .................................. H05K 3/30
[52] U.S. Cl. ........................ 29/740; 29/743; 29/759
[58] Field of Search .......... 29/740, 741, 743, 836–840, 29/759

[56] References Cited

U.S. PATENT DOCUMENTS 4,787,137 11/1988 Jeanmairet et al. .............. 29/740
4,858,308 8/1989 Komori ............................ 29/740

Primary Examiner—Carl E. Hall
Attorney, Agent, or Firm—Spencer T. Smith

[57] ABSTRACT

A tool bank is located in the path of a populated printed circuit board to minimize the travel required for tool tip changing. Prior to removal of the populated printed circuit board, the tool bank is displaced below the printed circuit.

3 Claims, 2 Drawing Sheets

TOOL BANK FOR SURFACE MOUNT MACHINE

The present invention relates to machines which place surface mounted electronic components on printed circuit boards.

Conventionally surface mounted electronic components are picked up by engaging the top flat surface of the component with a vacuum tool. As the size of the component increases, so too must the size of the vacuum tool. Accordingly, banks of vacuum tools having different sizes are usually provided and the vacuum tools are changed as required.

U.S. Pat. No. 5,058,721 discloses a tool bank which holds a plurality of tools which are to be individually used.

It is an object of the present invention to provide an improved tool bank.

Other objects and advantages of the present invention will become apparent from the following portion of this specification and from the accompanying drawings which illustrate in accordance with the mandate of the patent statutes a presently preferred embodiment incorporating the principles of the invention.

Referring to the drawings.

In conventional machines for placing surface mount electronic components, a printed circuit board 10 to be populated with surface mount components, is supported on a slide 12 for displacement in the X direction and a tool head assembly 14 which will place the components is supported on a slide (not shown) for displacement in the transverse Y direction. The third movable element is the feeder (not shown) which is also supported on a slide for movement in the X direction so that different components can be selectively presented at a pick-up location in line with the Y movement of the tool head. The fourth and fifth motions required for machine operation are up and down (Z) motion of the tool head assembly and the rotation of the tool head about its axis. When the process is complete the circuit board is withdrawn in the X direction.

Figure 3:
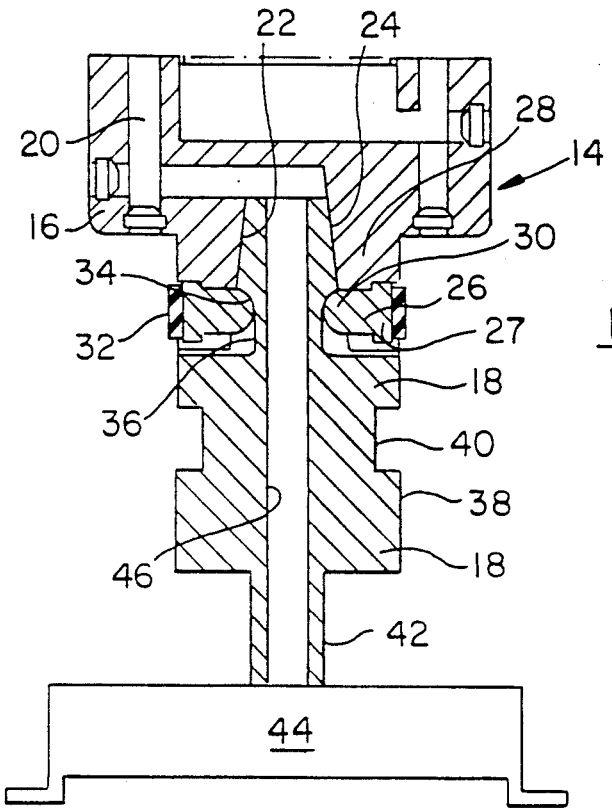
FIG. 3 is an enlarged cross sectional view of a portion of the tool holder shown in FIG. 1.

As can be seen from FIG. 3, the tool head assembly 14 includes a tool holder 16 and a tool 18. The tool holder has an interior vacuum line 20 which communicates with an outwardly tapered, conical port 22. A similarly tapered head 24 of the tool 18 is matingly received by this tapered conical port 22 and forced engagement therebetween is achieved by a plurality (three) of detents 26, each being shaped like a rivet having a head 27, a cylindrical body 28 and a spherical end 30, which are urged inwardly by an elastic band 32 against the arcuate, annular surface 34 connecting the tapered head 24 to a reduced diameter portion 36. The middle portion 38 of the tool 18 is cylindrical and has an annular circumferential groove 40. The tool ends with a tip 42 for engaging a component 44. The tool holder vacuum line 20 communicates with a vacuum conduit 46 in the tool.

Figure 4:
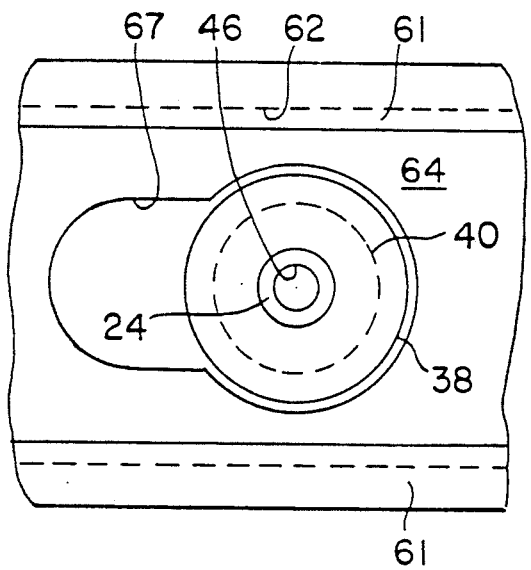
FIG. 4 is a view taken at 4—4 of FIG. 1 with the tools released.
Figure 5:
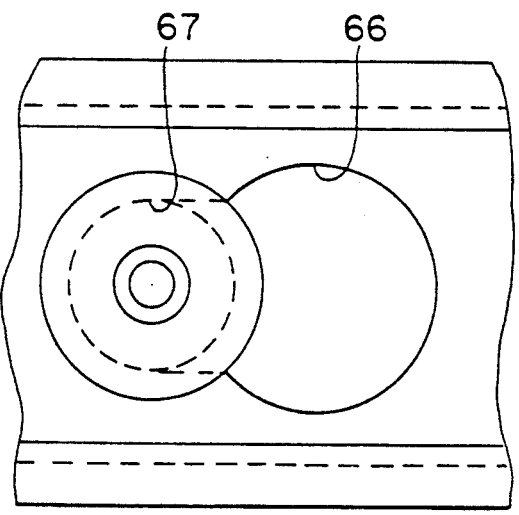
FIG. 5 is a view similar to that of FIG. 4 with the tools locked in position.

A tool bank 50 includes a block 52 having a plurality of tool receiving pockets 54. Each pocket has an upper cylindrical portion 56 for receiving the middle portion 38 of a tool and a reduced diameter portion 58 so that the middle portion 38 will sit on the annular ledge 60 defined where the upper cylindrical portion 56 meets the reduced diameter portion 58. The block, at the top has a pair of opposed ears 61 (FIGS. 4 and 5) which extend along the length of the block and which partially overlie a channel 62 which also extends the length of the block and slidably receives a locking plate 64. The vertical location of this plate 64 corresponds to the location of the annular grooves 40 in the tools.

At each tool location, the locking plate has a hole which has a large circular portion 66 at one end and a smaller partially circular portion 67 at the other end. When located with the large circular portion 66 concentric with a tool, the tool can pass through the hole 66 but when the plate is shifted horizontally the smaller partially circular portion 67 of the hole will engage each tool within the channel or groove 40 thereby locking it in the block 52. The tools will accordingly be free for insertion or removal when the late is located in one position and will be locked in the block when the plate is shifted to the second position in engagement with the tools. Such displacement is effected by a pneumatic cylinder 70 which is mounted on the tool bank frame 72. A bracket 74 interconnects the rod 76 of the pneumatic cylinder and the locking plate. Since the tools are mechanically locked in the tool bank and can thereby be forcefully pulled from the tool head, they can be held in the tool holder with a very substantial force. This improves the vacuum seal between a tool holder and the tool thereby maximizing the vacuum force applied to a component.

Figure 2:
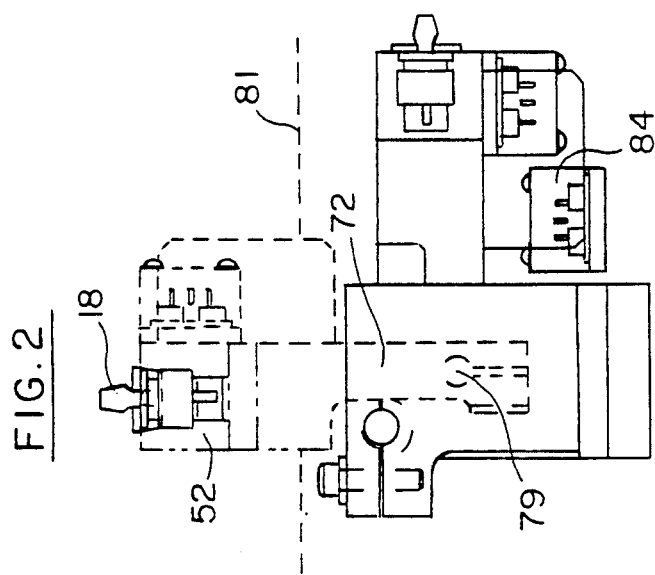
FIG. 2 is a view taken along lines 2—2 of FIG. 1.
Figure 1:
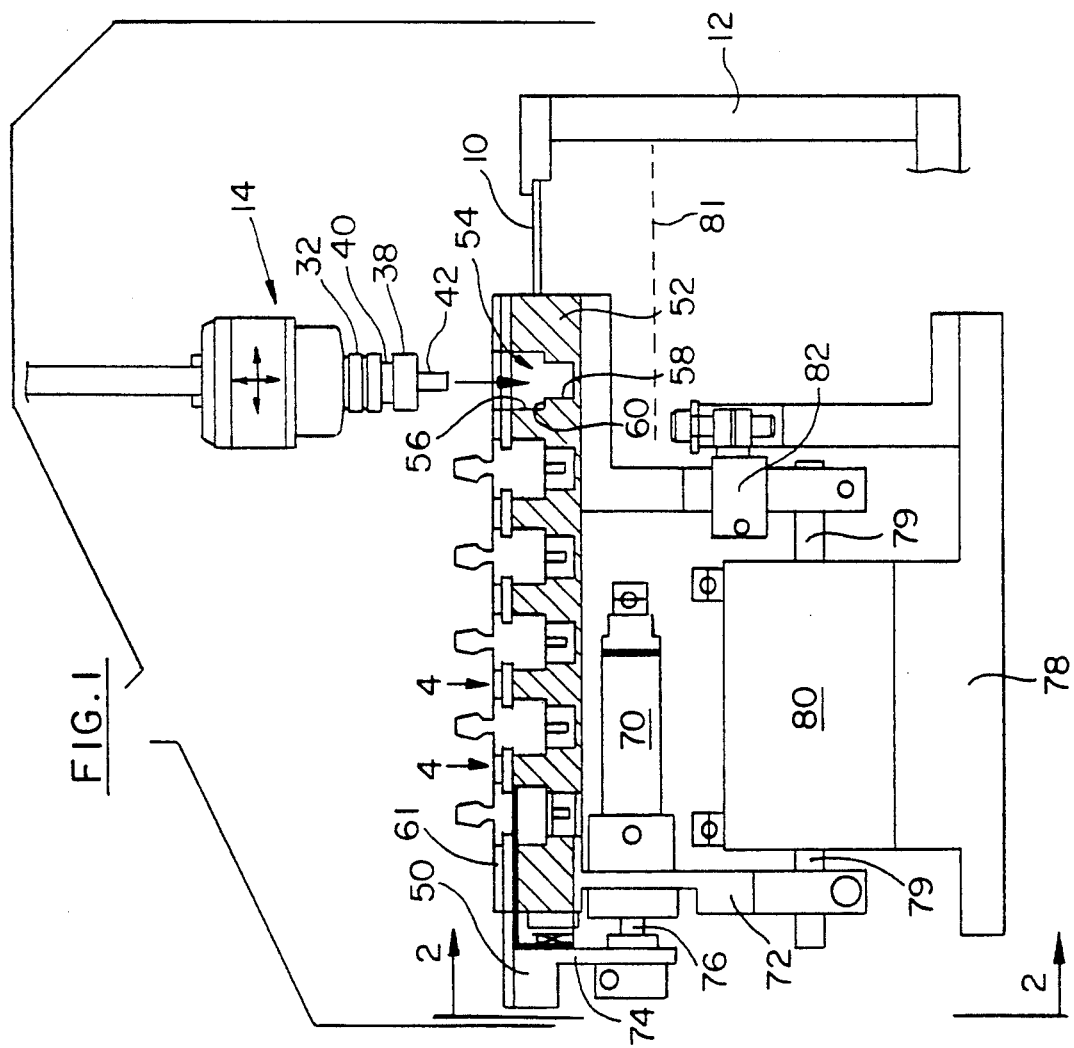
FIG. 1, is an elevational view illustrating a tool head of a machine for placing surface mount components operating in conjunction with a bank of tools.

Prior to component placement, the board is advanced in the X direction onto the X table and secured in position. Adjacent the front edge of the secured board (the edge of the board that will move forwardly when the board is to be removed from the X table) is the tool bank. The board and the tool bank move together during the placing of components since the X table 11 which includes the tool bank 50 supports both the printed circuit board and the tool bank base 78. As can be seen from FIG. 1, the tool bank projects above the printed circuit board. This minimizes the vertical distance that the tool head must travel to change tools.

the tool bank has a pair of supports 72 which are secured to the output shaft 79 of a rotary vane air cylinder 80 so that the tool bank can be pivotally displaced from the up position 90° to a down position below the underboard clearance line 81 so that the completed board can be withdrawn from the X table. Physical stops 82, 84 are provided to positively locate the tool rack at these positions. Whenever it is desired to lock the tools in the tool bank (a tool is to be pulled from the tool holder or the tool bank is to be moved to the down position), the locking plate is shifted to the locking position.

We claim:

1. A machine for placing surface mount electronic components on a printed circuit board comprising
tool holder means selectively displaceable vertically and horizontally to deposit surface mount components on the supported printed circuit board, and
a table for supporting a printed circuit board for displacement so that surface mount components can be populated thereon, the printed circuit board having a front edge which will move forwardly when the placement process is complete and the printed circuit board is to be removed from the table, said table including tool bank means for holding a plurality of tools for use in said tool holder means, means for supporting said tool bank means so that it can be displaced from a first location adjacent the front edge of a supported printed circuit board so that held tools will project upwardly above the underboard clearance line of the printed circuit board to a lowered position whereat said tool bank means and the held tools will be below the underboard clearance line, means for displacing said tool bank means from said location adjacent the front edge of a supported printed circuit board to said lowered position whereat said tool bank means and the held tools will be below the underboard clearance line of the printed circuit board, and means for releasably securing the tools in said tool bank means.

2. A machine according to claim 1, wherein said releasably securing means comprises latch means movable between locking and release positions and each of said tools includes catch means cooperating with said latch means when said latch means is located at said locking position and further comprising means for displacing said latch means between said locking and release positions.

3. A machine according to claim 1, wherein said supporting means includes a rotary vane air cylinder having a rotatable output shaft and wherein said tool bank means includes support means secured to said output shaft.

* * * * *